United States Patent
Kume et al.

(10) Patent No.: US 6,319,331 B1
(45) Date of Patent: Nov. 20, 2001

(54) METHOD FOR PROCESSING SEMICONDUCTOR SUBSTRATE

(75) Inventors: Morihiko Kume; Hidekazu Yamamoto, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/200,603

(22) Filed: Nov. 30, 1998

Related U.S. Application Data

(63) Continuation-in-part of application No. 09/079,279, filed on May 15, 1998.

(30) Foreign Application Priority Data

Dec. 1, 1997 (JP) .................................................. 9-330195
Nov. 26, 1998 (JP) ................................................. 10-335994

(51) Int. Cl.[7] .............................. C23G 1/02; C03C 23/00; B08B 5/04
(52) U.S. Cl. ..................................... 134/3; 134/2; 134/21
(58) Field of Search ....................................... 134/3, 21, 2

(56) References Cited

U.S. PATENT DOCUMENTS

| | | | |
|---|---|---|---|
| 4,749,440 | * | 6/1988 | Blackwood et al. ................. 156/646 |
| 5,451,267 | * | 9/1995 | Stadler et al. .......................... 134/30 |
| 5,503,708 | * | 4/1996 | Koizumi et al. ................... 156/643.1 |
| 5,545,289 | * | 8/1996 | Chen et al. ........................ 156/643.1 |
| 5,849,643 | * | 12/1998 | Gilmer et al. ........................ 438/773 |
| 5,853,491 | * | 12/1998 | Schulz ..................................... 134/2 |

\* cited by examiner

*Primary Examiner*—Randy Gulakowski
*Assistant Examiner*—Yolanda Wilkins
(74) *Attorney, Agent, or Firm*—Oblon, Spivak, McClelland, Maier & Neustadt, P.C.

(57) ABSTRACT

An object is to provide a method for processing a semiconductor substrate that can form an oxide film less prone to take in impurities affecting semiconductor characteristics on the surface. An RCA-cleaned semiconductor substrate is treated with diluted hydrofluoric acid (HF) to remove a native oxide film formed on the semiconductor substrate during the RCA cleaning process (step S8). For conditions of the treatment with diluted hydrofluoric acid, the concentration of hydrofluoric acid is about 50%, the ratio of hydrofluoric acid to pure water is 1:100, and the processing time is about one minute. Finally, the semiconductor substrate from which the native oxide film has been removed is stored in a clean atmosphere of oxygen for a predetermined time period to form an oxide film on the semiconductor substrate surface (step S9). The percentage of oxygen in the atmosphere of oxygen in the place for storage is about 20 to 100%.

7 Claims, 8 Drawing Sheets

METHOD FOR PROCESSING SEMICONDUCTOR SUBSTRATE

This application is a Continuation-in-part (CIP) of application Ser. No. 09/079,279 Filed on May 15, 1998

BACKGROUND OF THE INVENTION

1. Field of the Invention

The present invention relates to methods for processing semiconductor substrates, and particularly to a method for processing semiconductor substrates in which contamination by impurities is prevented.

2. Description of the Background Art

Semiconductor substrates (e.g., silicon substrates) are cleaned as pretreatment prior to semiconductor device manufacturing process. The RCA cleaning process is commonly used for the cleaning. In the RCA cleaning process, semiconductor substrates are subjected to an SPM cleaning process using a mixture of sulfuric acid ($H_2SO_4$), hydrogen peroxide solution ($H_2O_2$), and pure water ($H_2O$) as cleaning solution, an APM cleaning process using a mixture of ammonia ($NH_4OH$), hydrogen peroxide solution ($H_2O_2$), and pure water ($H_2O$) as cleaning solution, and an HPM cleaning process using a mixture of hydrochloric acid (HCl), hydrogen peroxide solution ($H_2O_2$), and pure water ($H_2O$) as cleaning solution.

The SPM cleaning is suitable for removal of organic matter, the APM cleaning is suitable for removal of organic matter and heavy metals, and the HPM cleaning is suitable for removal of heavy metals. Cleaning process with pure water is performed between the individual cleaning processes described above. Only the SPM cleaning process and the APM cleaning process may be applied instead of applying all of the three kinds of cleaning processes While the RCA cleaning process removes organic matter and heavy metals away from the surface of a semiconductor substrate, an oxide film is formed on the semiconductor substrate surface during the cleaning process. The film is formed of native oxide naturally formed by dissolved oxygen in pure water and oxidizing action of hydrogen peroxide solution. This phenomenon is described in Japanese Patent Laying-Open No. 7-86220, Japanese Patent Laying-Open No. 5-29292, and Japanese Patent Laying-Open No. 63-29516.

FIG. 7 and FIG. 8 show results obtained by analyzing a native oxide film on a semiconductor substrate by SIMS (Secondary Ion Mass Spectrometry). FIG. 7 shows the results obtained by analyzing boron in a native oxide film on a semiconductor substrate immediately after application of the RCA cleaning. FIG. 8 shows the results obtained by analyzing boron in a native oxide film on a semiconductor substrate left in clean air for several hours after application of the RCA cleaning process. In either of the drawings, the abscissa shows depth ($\mu m$) and the ordinate shows concentration (Atom/$cm^3$).

As shown in FIG. 7, immediately after the RCA cleaning process, the concentration of boron in the oxide film is not higher than the lowest limit of detection and is hidden in the background. However, as shown in the area X in FIG. 8, the concentration of boron becomes higher in the vicinity of the surface when it is left in clean air. This means that boron contained in air has been taken into the native oxide film on the semiconductor substrate. Needless to say, if boron acting as a semiconductor impurity moves into semiconductor layers after formation of semiconductor devices, it will exert influence on the characteristics of the semiconductor devices. Especially, when semiconductor substrates are moved into semiconductor device manufacturing process without removing the native oxide film after cleaning, it is necessary to take the utmost care to avoid inclusion of boron in the oxide film. However, as stated above, there is the problem that the native oxide film formed during the cleaning process of semiconductor substrates takes in boron when left in air. For other substances existing in air and affecting semiconductor characteristics, it is also necessary to avoid inclusion of phosphorus and sodium in the oxide film.

SUMMARY OF THE INVENTION

According to a first aspect of the present invention, a method for processing a semiconductor substrate comprises the steps of: (a) applying an RCA cleaning process to the semiconductor substrate; (b) removing a native oxide film formed on a surface of the semiconductor substrate during the RCA cleaning process; and (c) exposing the semiconductor substrate from which the native oxide film has been removed to a clean atmosphere of oxygen with an oxygen percentage of 20 to 100% to form an oxide film having a thickness reaching the saturation thickness on the surface of the semiconductor substrate.

Preferably, according to a second aspect of the present invention, in the method for processing a semiconductor substrate, the step (c) comprises the steps of preparing a vacuum chamber having an evacuating device, putting the semiconductor substrate from which the native oxide film has been removed in the vacuum chamber, evacuating air from the vacuum chamber to make a vacuum, and then introducing oxygen into the vacuum chamber.

Preferably, according to a third aspect of the present invention, in the method for processing a semiconductor substrate, the step (c) comprises the steps of preparing a closed chamber, putting the semiconductor substrate from which the native oxide film has been removed in the closed chamber, removing air from the closed chamber by replacement, and then introducing oxygen into the closed chamber.

Preferably, according to a fourth aspect of the present invention, in the method for processing a semiconductor substrate, the step (c) comprises the step of supplying vapor of pure water so that the humidity in the atmosphere of oxygen is 40% or higher.

According to a fifth aspect of the present invention, a method for processing a semiconductor substrate comprises the steps of: (a) applying an RCA cleaning process to the semiconductor substrate; (b) removing a native oxide film formed on a surface of the semiconductor substrate during the RCA cleaning process; and (c) immersing the semiconductor substrate from which the native oxide film has been removed in pure water at 20 to 100° C. to form an oxide film having a thickness reaching 10 to 15 angstroms on the surface of the semiconductor substrate.

Preferably, according to a sixth aspect of the present invention, in the method for processing a semiconductor substrate, the step (c) comprises the step of immersing the semiconductor substrate in pure water for 10 to 20 hours.

According to a seventh aspect of the present invention, a method for processing a semiconductor substrate comprises the steps of: (a) applying an SPM cleaning process using a mixture of sulfuric acid, hydrogen peroxide solution and pure water as a cleaning solution to the semiconductor substrate; and (b) applying an APM ozonized-water cleaning process using a mixture of ammonia, hydrogen peroxide solution, pure water and ozonized water as a cleaning solution to the SPM-cleaned semiconductor substrate to form an oxide film on a surface of the semiconductor substrate.

Preferably, according to an eighth aspect of the present invention, in the method for processing a semiconductor substrate, the step (b) comprises the step of adding the ozonized water so that the concentration of ozone in the entire solution is 1 to 10 ppm.

According to the semiconductor substrate processing method of the first aspect of the present invention, it is possible to form an oxide film that takes in no impurities contained in air even if it is left in air on a surface of a semiconductor substrate by exposing a semiconductor substrate from which a native oxide film formed during an RCA cleaning process has been removed to an atmosphere of oxygen having at least clean room level cleanliness and having an oxygen concentration percentage of 20 to 100%. Accordingly, even if the cleaned semiconductor substrate is put in semiconductor device manufacturing process without removing the oxide film on the semiconductor substrate, characteristics of the semiconductor devices are not affected. It is then not necessary to remove the oxide film on the semiconductor substrate, thus simplifying semiconductor device manufacturing process.

According to the semiconductor substrate processing method of the second aspect of the present invention, it is possible to obtain an oxide film that contains an extremely small amount of impurities and takes in no impurities contained in air even if it is left in air.

According to the semiconductor substrate processing method of the third aspect of the present invention, it is possible to relatively easily obtain an oxide film that takes in no impurities in air even if it is left in air.

According to the semiconductor substrate processing method of the fourth aspect of the present invention, it is possible to obtain an oxide film having a desired thickness faster than in formation in a clean atmosphere of oxygen.

According to the semiconductor substrate processing method of the fifth aspect of the present invention, it is possible to obtain relatively easily and in a short period of time an oxide film that takes in no impurities existing in air even if it is left in air. Furthermore, since it is possible to form an oxide film to a thickness equal to or larger than the saturation thickness in air by immersing a semiconductor substrate in pure water, an oxide film having a thickness that cannot be formed in air can be obtained.

According to the semiconductor substrate processing method of the sixth aspect of the present invention, it is possible to obtain an oxide film having a thickness equal to the saturation thickness in air.

According to the semiconductor substrate processing method of the seven aspect of the present invention, it is possible to form an oxide film that takes in no boron even if left in air in semiconductor substrate cleaning process, which simplifies the processing steps as compared with the method in which an oxide film taking in no boron is formed after removing an oxide film formed in the cleaning process.

According to the semiconductor substrate processing method of the eighth aspect of the present invention, it is possible to easily obtain APM ozonized-water cleaning solution capable of forming an oxide film taking in no boron even if left in air.

The present invention has been made to solve the problem discussed above, and an object of the present invention is to provide a method for processing a semiconductor substrate capable of forming an oxide film less prone to take in impurities affecting semiconductor characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

<A-1. Processing Method>

Figure 1:
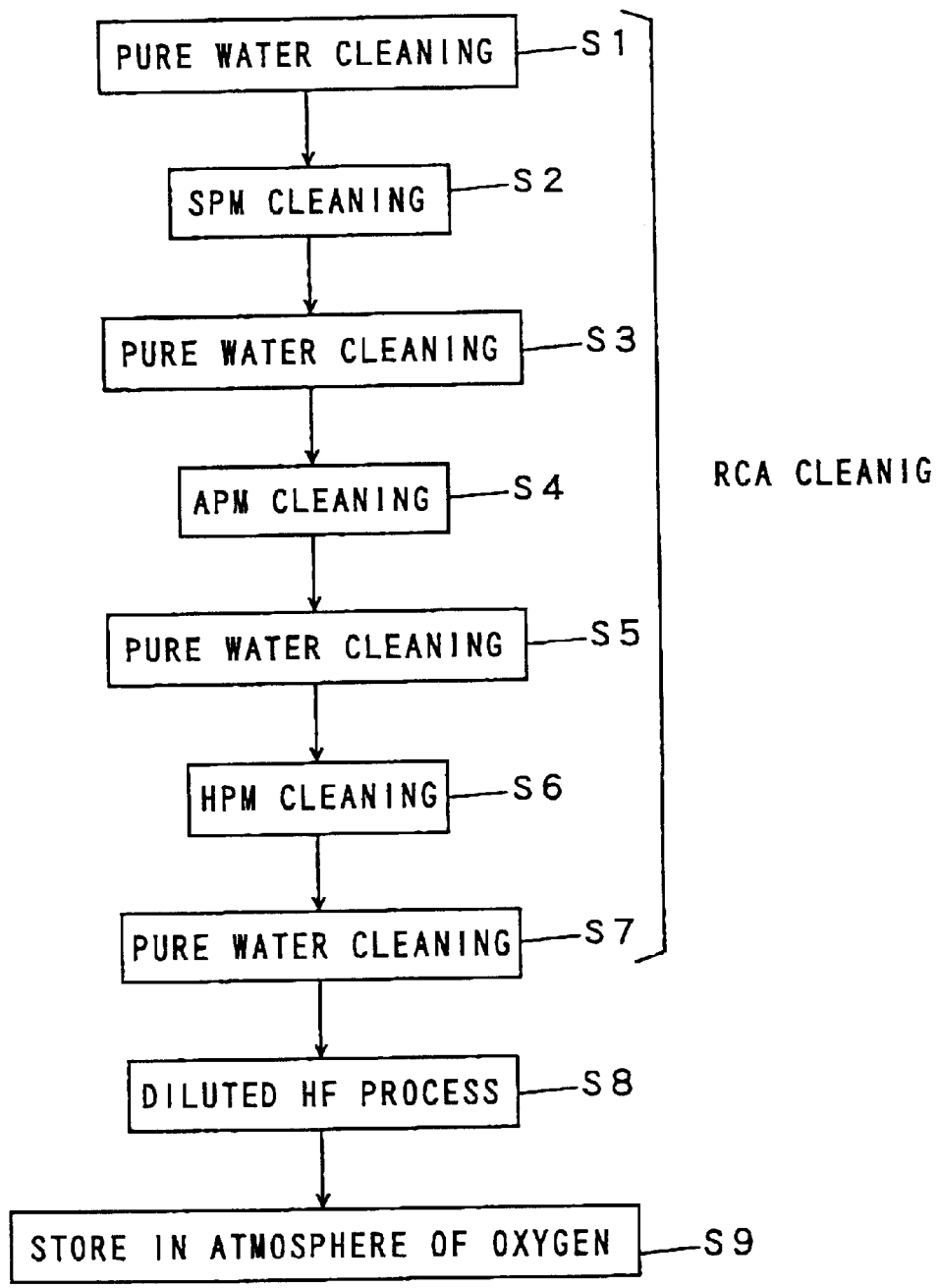
FIG. 1 is a flow chart illustrating a method for processing a semiconductor substrate according to a first preferred embodiment of the present invention.

Referring to the flow chart in FIG. 1, a first preferred embodiment of a method for processing a semiconductor substrate according to the present invention will be described.

First, as shown in steps S1 to S7, an RCA cleaning process is applied to a semiconductor substrate (a silicon substrate herein). Specifically, an SPM (Sulfuric-Hydrogen Peroxide Mixture) cleaning process (step S2) using a mixture of sulfuric acid ($H_2SO_4$), hydrogen peroxide solution ($H_2O_2$), and pure water ($H_2O$) as cleaning solution, an APM (Ammonia-Hydrogen Peroxide Mixture) cleaning process (step S4) using a mixture of ammonia ($NH_4OH$), hydrogen peroxide solution ($H_2O_2$), and pure water ($H_2O$) as cleaning solution, and an RPM (Hydrochloric acid-Hydrogen Peroxide Mixture) cleaning process (step S6) using a mixture of hydrochloric acid (HCl), hydrogen peroxide solution ($H_2O_2$), and pure water ($H_2O$) as cleaning solution are sequentially performed.

Here, for conditions of the SPM cleaning process, the concentration of sulfuric acid is about 98%, the concentration of hydrogen peroxide solution is about 31%, the ratio of sulfuric acid to hydrogen peroxide solution is 5:1, and the processing time is about ten minutes. For conditions of the APM cleaning process, the concentration of ammonia is about 29%, the concentration of hydrogen peroxide solution is about 31%, the ammonia-hydrogen peroxide solution-pure water ratio is 1:1:5, and the processing time is about ten minutes. For conditions of the HPM cleaning process, the concentration of hydrochloric acid is about 37%, the concentration of hydrogen peroxide solution is about 31%, the hydrochloric acid-hydrogen peroxide solution-pure water ratio is 1:1:6, and the processing time is about ten minutes.

Pure water cleaning process for cleaning the semiconductor substrate with pure water is performed before the SPM cleaning process, after the HPM cleaning process, and between the individual cleaning processes (steps S1, S3, S5, S7). In the RCA cleaning process, only the SPM cleaning process and the APM cleaning process may be performed instead of performing all of the three kinds of cleaning processes discussed above.

After the RCA cleaning process, the semiconductor substrate is treated with diluted hydrofluoric acid (HF) to remove a native oxide film formed on the semiconductor substrate during the RCA cleaning process (step S8). For conditions of the diluted hydrofluoric acid treatment, the concentration of hydrofluoric acid is about 50%, the ratio of hydrofluoric acid to pure water is 1:100, and the processing time is about one minute.

Finally, the semiconductor substrate from which the native oxide film has been removed is stored in a clean atmosphere of oxygen for a predetermined time period to form an oxide film on the semiconductor substrate surface (step S9). Here, the percentage of oxygen in the oxygen atmosphere in the place for storage is about 20 to 100%. If it is defined with the cleanliness in a clean room for manufacturing of semiconductor devices, it can be a clean atmosphere of oxygen at class 100 or lower, for example.

More ideally, it is stored in a vacuum chamber filled with oxygen to about atmospheric pressure or lower with air evacuated. More simply, it can be stored in a closed chamber in which air has been replaced by nitrogen or the like and the nitrogen has been replaced by oxygen. In this case, the pressure of oxygen in the chamber is kept higher than atmospheric pressure to keep air out. Alternatively, oxygen is supplied and discharged constantly. For still more simply, it may be stored in a chamber, such as a desiccator, placed in a clean room.

The storage time, depends on the concentration of oxygen. If it is considered on the basis of the time at which the growth of oxide film stops (saturation time), it is about 24 to 48 hours in the still simpler case in which it is stored in clean room air. The thickness of oxide film in this case is about 10 to 15 angstroms.

Figure 2:
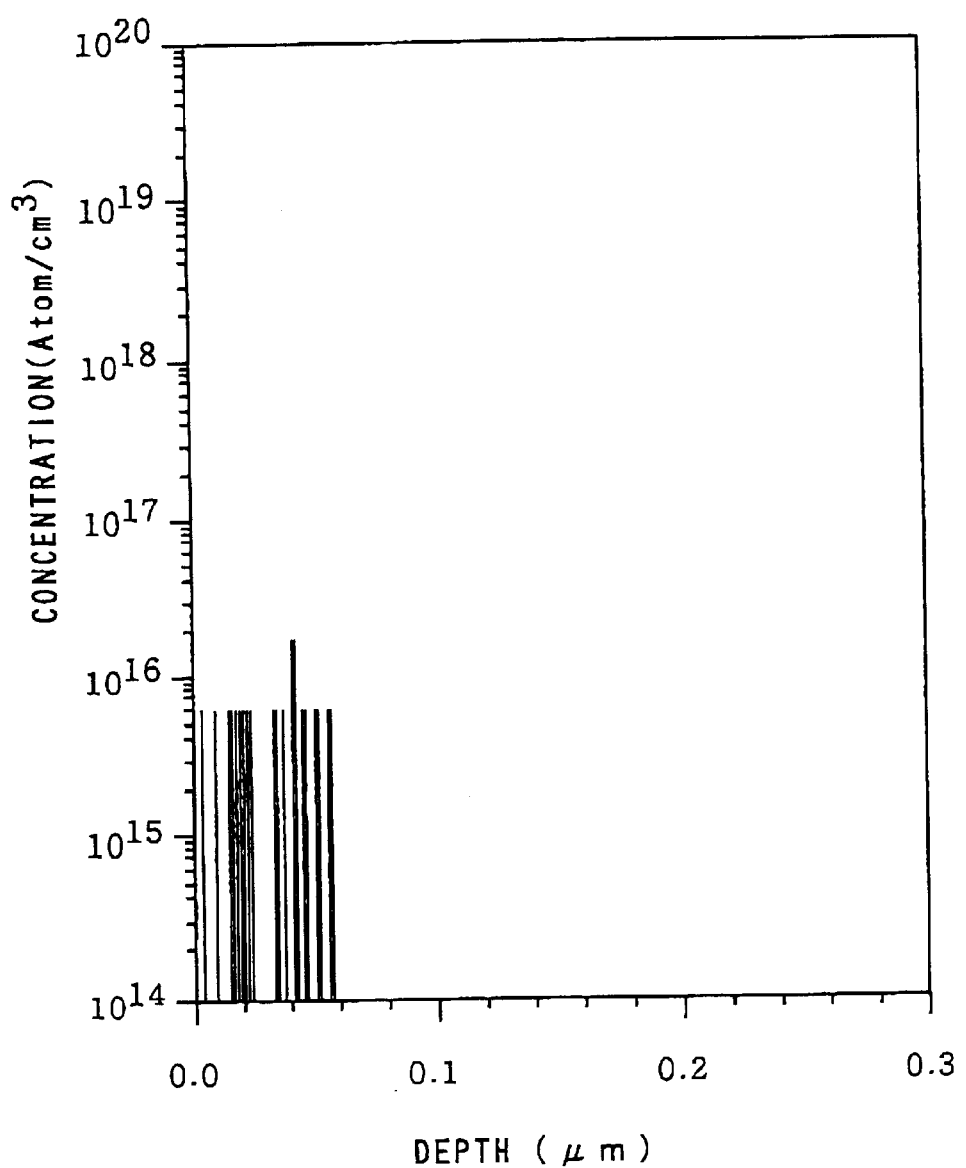
FIG. 2 is a diagram showing results obtained by SIMS-analyzing an oxide film immediately after it was formed by the semiconductor substrate processing method according to the first preferred embodiment of the present invention.
Figure 3:
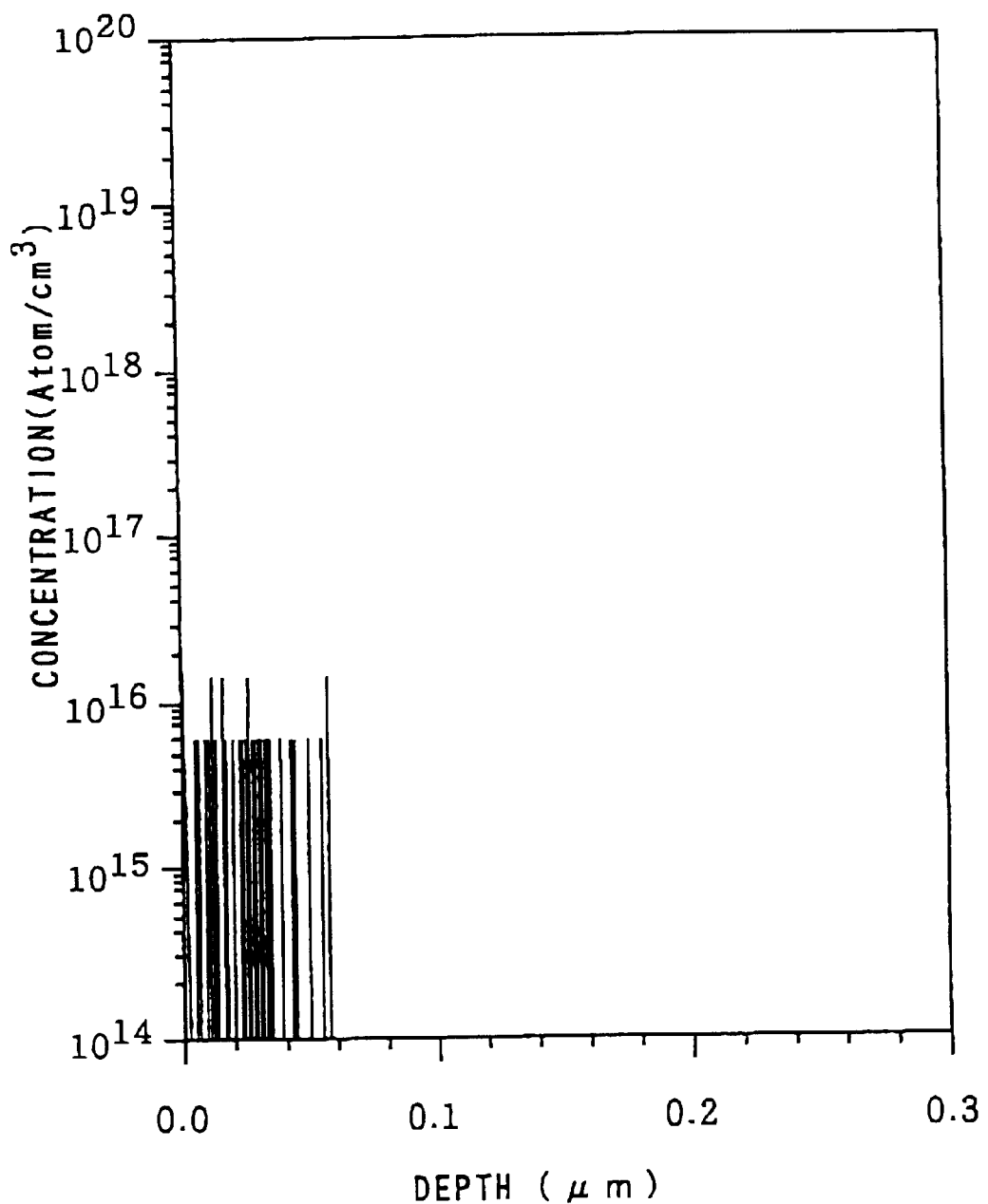
FIG. 3 is a diagram showing results obtained by SIMS-analyzing an oxide film that was formed by the semiconductor substrate processing method according to the first preferred embodiment of the present invention and was left in air.

FIG. 2 and FIG. 3 show results obtained by analyzing an oxide film formed this way on a semiconductor substrate by SIMS (Secondary Ion Mass Spectrometry). FIG. 2 shows the results obtained by analyzing boron in an oxide film on a semiconductor substrate immediately after the formation and FIG. 3 shows the results obtained by analyzing boron in an oxide film on a semiconductor substrate after it has been left for several hours in clean room air after the formation. In either of the diagrams, the abscissa shows the depth ($\mu$m) and the ordinate shows the concentration (Atom/cm$^3$).

As shown in FIG. 2, the concentration of boron in the oxide film is not higher than the lowest limit of detection (not higher than $1 \times 10_{15}$ Atom/cm$^3$) and is hidden in the background immediately after the formation. After it is left in clean room air, as shown in FIG. 3, the concentration of boron in the oxide film is not higher than the lowest limit of detection as well, and it is hidden in the background. This means that an oxide film formed in a clean atmosphere of oxygen does not take in boron even if it is left in air.

One of possible reasons that boron is not taken in is that the oxide film formed in a clean atmosphere of oxygen has denser structure than a native oxide film formed in the RCA cleaning process Japanese Patent Laying-Open No. 7-86220 mentioned before discloses technology of utilizing a native oxide film formed in cleaning process. However, this reference does not recognize the above-discussed problem that a native oxide film formed during cleaning process has the property of introducing boron.

<A-2. Characteristic Functions and Effects>

As has been described so far, according to the processing method of the first preferred embodiment, it is possible to relatively easily obtain an oxide film that does not take in boron even if it is left in air. Accordingly, even if a cleaned semiconductor substrate is put in semiconductor device manufacturing process without removing the oxide film on the semiconductor substrate, no boron moves from the oxide film into semiconductor layers to affect the characteristics of the semiconductor devices. It is then not necessary to remove the oxide film on the semiconductor substrate, which simplifies the process of manufacturing semiconductor devices.

B. Second Preferred Embodiment

<B-1. Processing Method>

Figure 4:
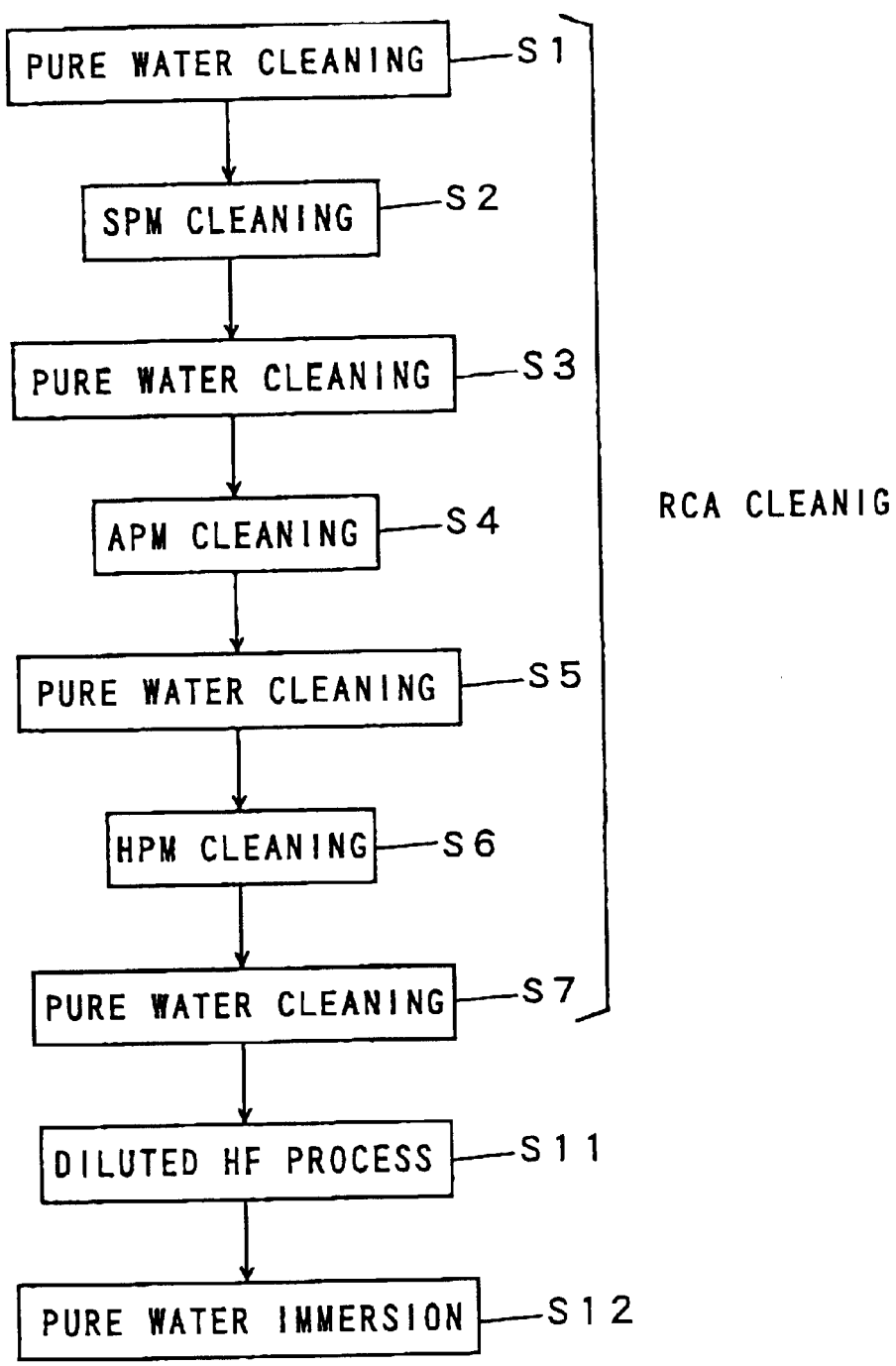
FIG. 4 is a flow chart illustrating a method for processing a semiconductor substrate according to a second preferred embodiment of the present invention.

Referring to the flow chart shown in FIG. 4, a second preferred embodiment of a method for processing a semiconductor substrate according to the present invention will be described.

First, as shown in steps S1 to S7, the RCA cleaning process is applied to a semiconductor substrate. In the RCA cleaning process, only the SPM and APM cleaning processes may be applied.

Next, the RCA-cleaned semiconductor substrate is treated with diluted hydrofluoric acid to remove a native oxide film formed on the semiconductor substrate during the RCA cleaning process (step S11).

Finally, the semiconductor substrate from which the native oxide film has been removed is immersed in pure water for a predetermined time period to form an oxide film on the semiconductor substrate surface (step S12). Here, the immersion time in pure water is about 10 to 20 hours and the temperature of pure water is 20 to 100° C.

The inventors and others carried out research to know that the growth rate of the oxide film in the case where the semiconductor substrate is immersed in pure water is 1.4 times faster than that in an atmosphere of oxygen. It was also known that the oxide film continues growing without saturating in pure water.

For example, when it is immersed in pure water at 23° C. (room temperature in a clean room), the oxide film continues growing without saturating even after an elapse of 1000 minutes (about 17 hours). The thickness of the oxide film in this case is over the saturation thickness in an atmosphere of oxygen (10 to 15 angstroms). When it is taken out into air, the oxidation stops.

It was known by SIMS that the oxide film formed this way on a semiconductor substrate does not take in boron even if it is left in clean room air. The results obtained by SIMS are not shown here, since they are the same as those described referring to FIG. 2 and FIG. 3.

As a possible reason that no boron is taken in, it is considered that the oxide film formed in pure water has denser structure than native oxide film formed during the RCA cleaning process. Japanese Patent Laying-Open No. 5-29292 describes that when a silicon substrate is rinsed with pure water, a native oxide film is formed on the surface of the silicon substrate. This is a conventionally and generally known phenomenon and Japanese Patent Laying-Open No. 5-29292 actually discusses it as conventional technology. Thus, although the technical idea of exposing a silicon substrate to pure water for a short period of time has conventionally been existing, the technical idea of the present invention of immersing a silicon substrate in pure water for a long period of time to form an oxide film taking in no boron has not been known. In addition, the thickness of oxide film does not reach the saturation thickness with the rinsing treatment disclosed in Japanese Patent Laying-Open No. 5-29292. If it is left in air in this state, it will continue growing while taking in boron contained in air. However, Japanese Patent Laying-Open No. 5-29292 describes that the oxide film formed in the rinsing treatment is soon removed, meaning that this reference does not recognize the inclusion of boron as a problem.

<B-2. Characteristic Functions and Effects>

As have been discussed so far, according to the processing method of the second preferred embodiment, it is possible to obtain, relatively easily and in a short time, an oxide film that does not take in boron even if it is left in air.

Further, since it is possible to form an oxide film to a thickness equal to or larger than the saturation thickness in air by immersing a semiconductor substrate in pure water, the oxide film can be formed to a thickness that cannot be formed in air.

<B-3. Modifications>

Although a method in which a semiconductor substrate is immersed in pure water at 20 to 100 C. has been described, an oxide film may be formed by storing a semiconductor substrate in a long period of time in an atmosphere with a water vapor density of 40% or higher.

For example, it is possible to form an oxide film that takes in no boron even if left in air by exposing a semiconductor substrate to an atmosphere with a humidity of as high as 80 to 90% for 10 to 20 hours. Humidity may be given by using a humidifier generating water vapor with ultrasonic wave, or by using vapor obtained by boiling pure water.

When this method is adopted, it is preferably performed in a clean atmosphere of oxygen. To obtain a clean atmosphere of oxygen, such methods as described in the first preferred embodiment may be adopted.

By adopting the methods discussed above, an oxide film with a desired thickness can be obtained faster than in a clean atmosphere of oxygen. It is also possible to adjust the rate of formation of the oxide film by adjusting the oxygen concentration.

C. Third Preferred Embodiment

<C-1. Processing Method>

Figure 5:
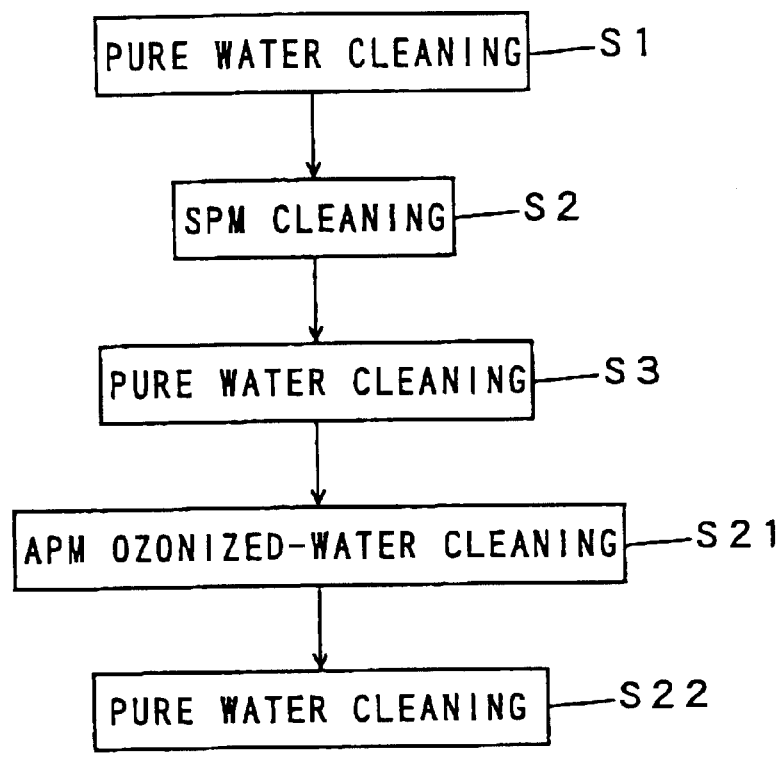
FIG. 5 is a flow chart illustrating a method for processing a semiconductor substrate according to a third preferred embodiment of the present invention.

A third preferred embodiment of a method for processing a semiconductor substrate according to the present invention will now be described referring to the flow chart shown in FIG. 5.

First, as shown in steps S1 to S3, a semiconductor substrate is cleaned by the SPM cleaning process. Next, after the SPM cleaning process, an APM ozonized-water cleaning process using a mixture of ammonia ($NH_4OH$), hydrogen peroxide solution ($H_2O_2$), pure water ($H_2O$), and ozonized water ($O_3$) as cleaning solution is applied to the semiconductor substrate (step S21), followed by a pure water cleaning process in the last step (step S22).

The quantity of ozonized water is set so that the ozone concentration in the entire solution is about 1 to 10 ppm. An oxide film is formed on the surface of the semiconductor substrate by the APM ozonized-water cleaning process.

The processing time of the APM ozonized-water cleaning process is about the same as that in conventional APM cleaning process (about ten minutes). The thickness of the formed oxide film has not reached the saturation thickness. Therefor it continues growing when left in clean room air. However, it was shown by SIMS analysis that the oxide film formed this way does not take in boron even if it is left in clean room air.

<C-2. Characteristic Functions and Effects>

As has been discussed above, according to the processing method of the third preferred embodiment, it is possible to form an oxide film that does not take in boron even when left in air by cleaning a semiconductor substrate with a Solution obtained by adding ozonized water to conventional APM cleaning solution. This simplifies the process steps as compared with the method in which an oxide film taking in no boron is formed after an oxide film formed in the cleaning process has been removed.

D. Fourth Preferred Embodiment

<D-1. Processing Method>

While the above-described processing method of the third preferred embodiment according to the invention has shown an example in which a semiconductor substrate is cleaned with an APM ozonized-water solution, an oxide film taking in no boron even when left in air may be formed by cleaning a semiconductor substrate with ozonized water.

Figure 6:
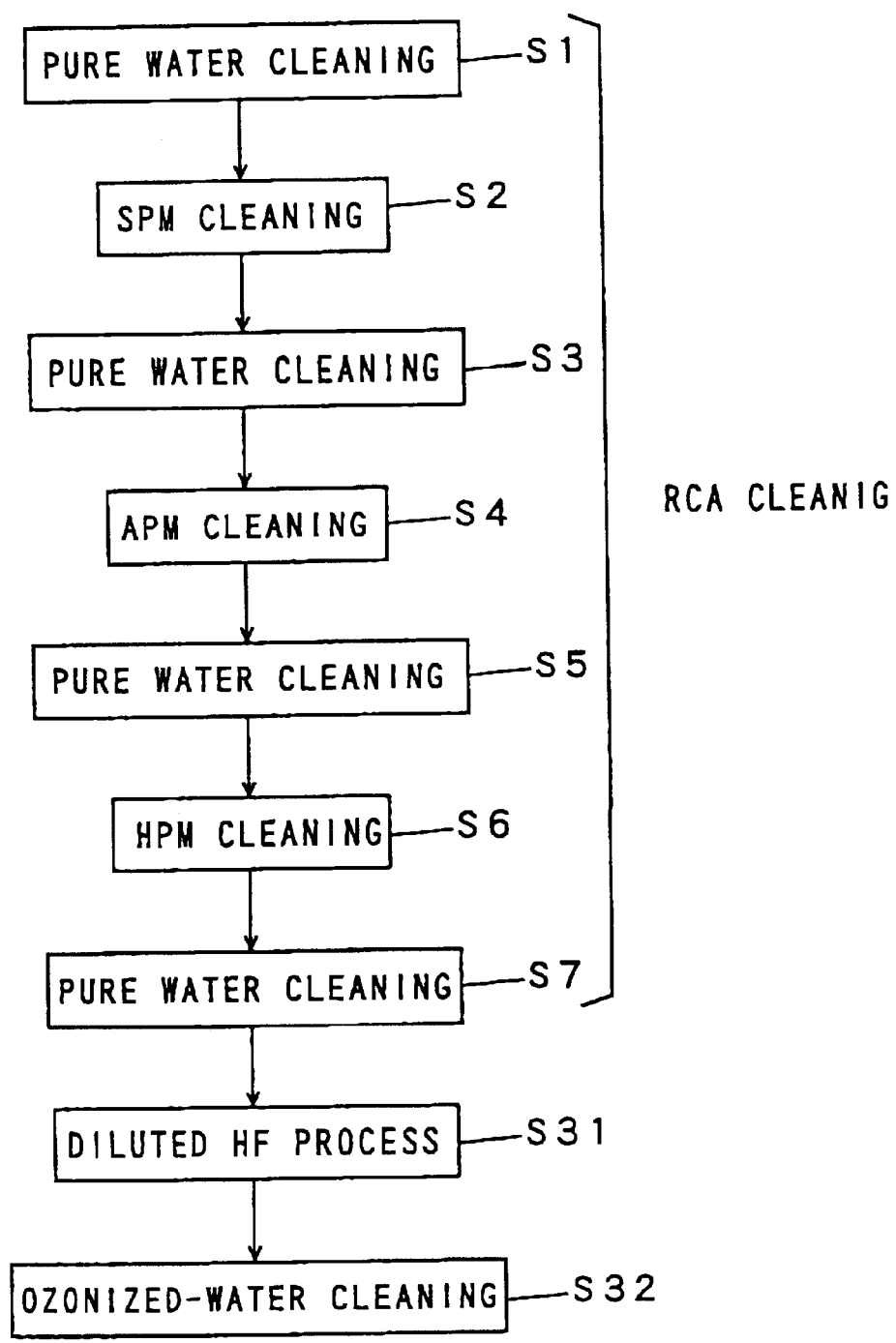
FIG. 6 is a flow chart illustrating a method for processing a semiconductor substrate according to a fourth preferred embodiment of the present invention.
Figure 7:
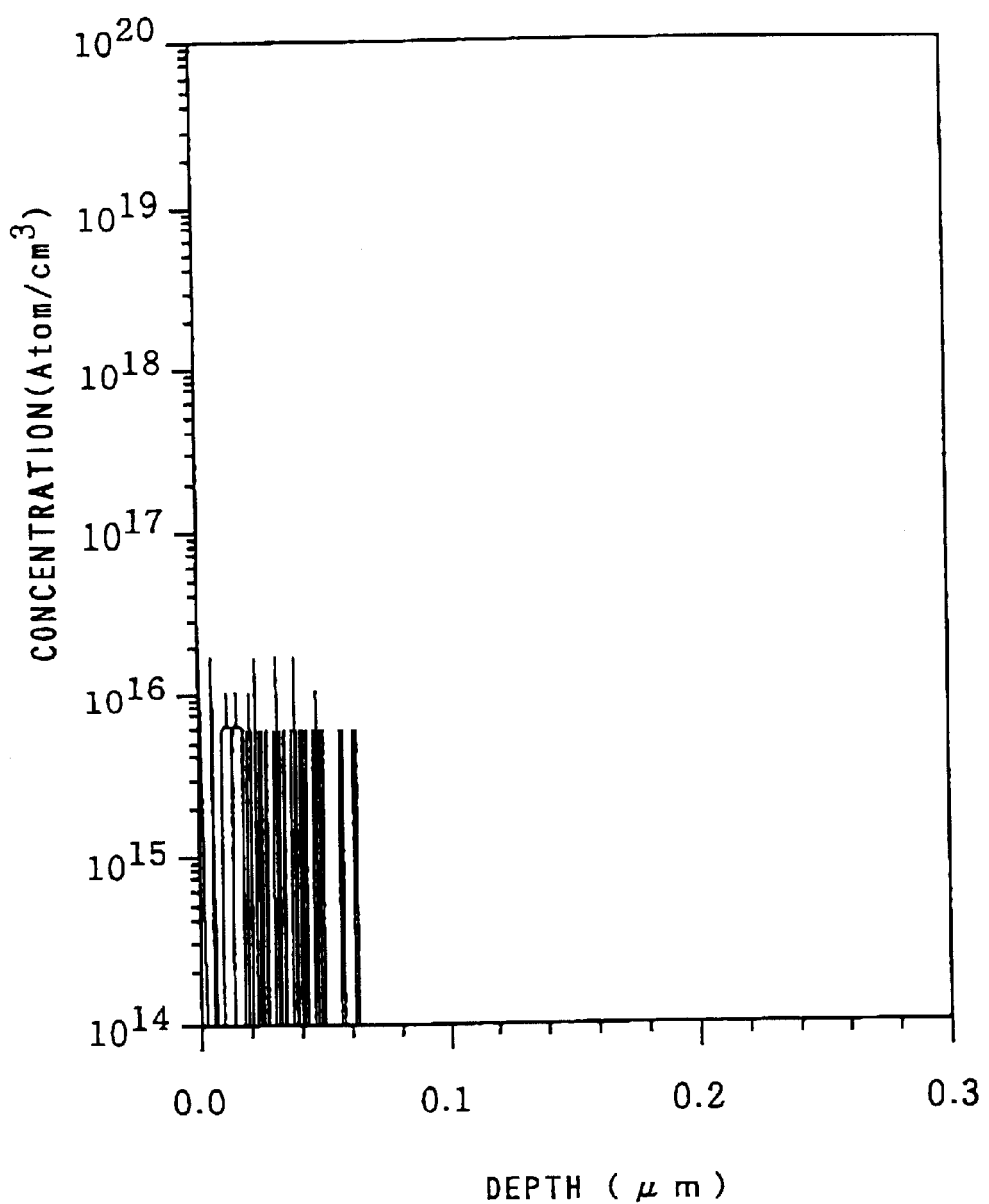
FIG. 7 is a diagram showing results obtained by SIMS-analyzing a native oxide film immediately after it was formed by the RCA cleaning process.
Figure 8:
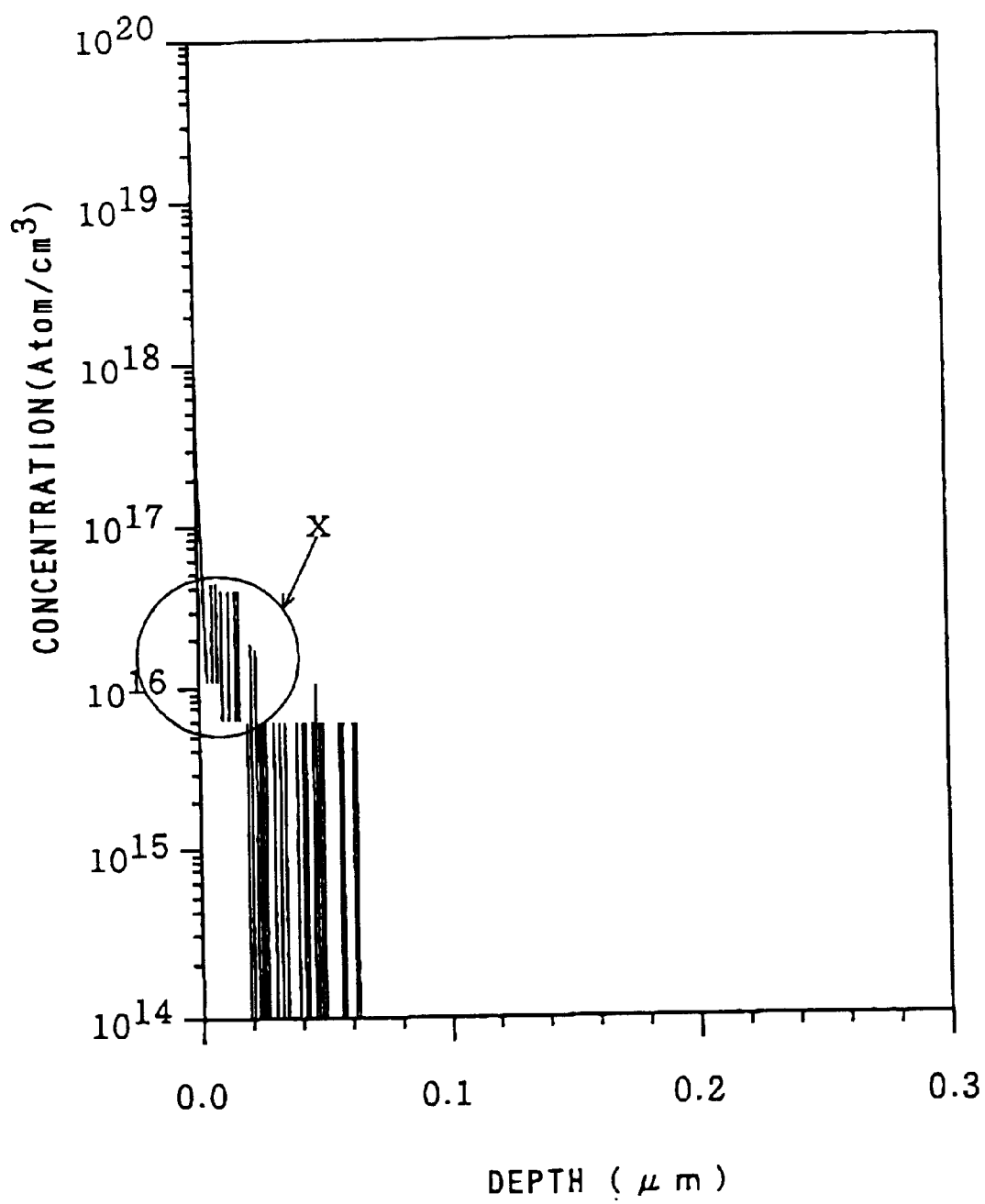
FIG. 8 is a diagram showing results obtained by SIMS-analyzing a native oxide film that was obtained by the RCA cleaning process and then left in air.

A method for processing a semiconductor substrate according to a fourth preferred embodiment of the present invention will now be described referring to the flow chart shown in FIG. 6.

First, as shown in steps S1 to S7, the RCA cleaning process is applied to a semiconductor substrate. In the RCA cleaning process, only the SPM and APM cleaning processes may be performed.

Next, the RCA-cleaned semiconductor substrate is treated with diluted hydrofluoric acid to remove a native oxide film on the semiconductor substrate formed during the RCA cleaning process (step S31).

Finally, the semiconductor substrate from which the native oxide film has been removed is cleaned by using ozonized water with an ozone concentration of about 5 to 10 ppm (step S32).

Although the processing time of the ozonized water cleaning is about three minutes, the thickness of the formed oxide film has been saturated. It was shown by the SIMS analysis that an oxide film formed this way does not take in boron even if it is left in clean room air.

<D-2. Characteristic Functions and Effects>

As has been described so far, according to the processing method of the fourth preferred embodiment, it is possible to form an oxide film that does not take in boron even if it is left in air relatively simply and in a very short time by cleaning a semiconductor substrate with ozonized water The processing methods of the first to fourth preferred embodiments described above have only discussed contamination by boron. However, needless to say, the processing methods of the invention provide an oxide film that does not take in phosphorus nor sodium that exist in air and affects the semiconductor characteristics.

While the invention has been described in detail, the foregoing description is in all aspects illustrative and not restrictive. It is understood that numerous other modifications and variations can be devised without departing from the scope of the invention.

This Application is based on Japanese Patent Applications P09-330195, filed Dec. 1, 1997 and P10-335994, filed Nov. 26, 1998, the entire disclosures of both being incorporated herein in their entirety.

We claim:

1. A method for processing a semiconductor substrate, comprising the steps of:
    (a) applying an RCA cleaning process to the semiconductor substrate;
    (b) removing a native oxide film formed on a surface of said semiconductor substrate during said RCA cleaning process; and
    (c) exposing said semiconductor substrate from which said native oxide film has been removed to a clean atmosphere of oxygen with an oxygen percentage of 20 to 100% under room temperature conditions to form an oxide film having a thickness reaching the saturation thickness on the surface of said semiconductor substrate.

2. The method for processing a semiconductor substrate according to claim 1, wherein said step (c) comprises the steps of preparing a vacuum chamber having an evacuating device, putting said semiconductor substrate from which said native oxide film has been removed in said vacuum chamber, evacuating air from said vacuum chamber to make a vacuum, and then introducing oxygen into said vacuum chamber.

3. The method for processing a semiconductor substrate according to claim 1, wherein said step (c) comprises the steps of preparing a closed chamber, putting said semiconductor substrate from which said native oxide film has been removed in said closed chamber, removing air from said closed chamber by replacement, and then introducing oxygen into said closed chamber.

4. The method for processing a semiconductor substrate according to claim 1, wherein said step (c) comprises the step of supplying vapor of pure water so that the humidity in said atmosphere of oxygen is 40% or higher.

5. A method for processing a semiconductor substrate, comprising the steps of:
    (a) applying an RCA cleaning process to the semiconductor substrate;
    (b) removing a native oxide film formed on a surface of said semiconductor substrate during said RCA cleaning process; and
    (c) immersing said semiconductor substrate from which said native oxide film has been removed in pure water at 20 to 100° C. to form an oxide film having a thickness reaching 10 to 15 angstroms on the surface of said semiconductor substrate.

6. The method for processing a semiconductor substrate according to claim 5, wherein said step (c) comprises the step of immersing said semiconductor substrate in pure water for 10 to 20 hours.

7. A method for processing a semiconductor substrate, comprising the steps of:
    (a) applying an SPM cleaning process using a mixture of sulfuric acid, hydrogen peroxide solution and pure water as a cleaning solution to the semiconductor substrate; and
    (b) applying an APM ozonized-water cleaning process using a mixture of ammonia, hydrogen peroxide solution, pure water and ozonized water as a cleaning solution to said SPM-cleaned semiconductor substrate to form an oxide film on a surface of said semiconductor substrate,
    wherein the concentration of ozone in the entire solution is 1 to 10 ppm.

* * * * *